United States Patent
Chao

(10) Patent No.: US 11,050,245 B2
(45) Date of Patent: Jun. 29, 2021

(54) SWITCH APPARATUS

(71) Applicant: RichWave Technology Corp., Taipei (TW)

(72) Inventor: Chuan-Chen Chao, Taipei (TW)

(73) Assignee: RichWave Technology Corp., Taipei (TW)

( * ) Notice: Subject to any disclaimer, the term of this patent is extended or adjusted under 35 U.S.C. 154(b) by 327 days.

(21) Appl. No.: 16/168,845

(22) Filed: Oct. 24, 2018

(65) Prior Publication Data
US 2019/0229532 A1 Jul. 25, 2019

(30) Foreign Application Priority Data

Jan. 19, 2018 (TW) .................................. 107101971

(51) Int. Cl.
| | |
|---|---|
| *H02H 9/04* | (2006.01) |
| *H03K 17/693* | (2006.01) |
| *H02H 9/02* | (2006.01) |
| *G05F 3/18* | (2006.01) |
| *H04B 3/46* | (2015.01) |

(52) U.S. Cl.
CPC ............. *H02H 9/046* (2013.01); *G05F 3/185* (2013.01); *H02H 9/025* (2013.01); *H03K 17/693* (2013.01); *H04B 3/46* (2013.01)

(58) Field of Classification Search
CPC ...... H02H 9/046; H02H 9/025; H03K 17/693; H03K 17/081; G05F 3/185; H04B 3/46
See application file for complete search history.

(56) References Cited

U.S. PATENT DOCUMENTS

| | | | |
|---|---|---|---|
| 4,631,470 A | 12/1986 | Bingley | |
| 5,856,904 A | 1/1999 | Pelly et al. | |
| 6,094,088 A * | 7/2000 | Yano | H03K 17/693 327/534 |
| 6,693,498 B1 * | 2/2004 | Sasabata | H03K 17/693 333/101 |

(Continued)

FOREIGN PATENT DOCUMENTS

| | | |
|---|---|---|
| EP | 2412208 | 8/2013 |
| TW | 477114 | 2/2002 |
| TW | 201528684 | 7/2015 |

OTHER PUBLICATIONS

"Office Action of Taiwan Related Application, application No. 107125264", dated Apr. 2, 2019, p. 1-p. 3.

(Continued)

*Primary Examiner* — Kyle J Moody
(74) *Attorney, Agent, or Firm* — JCIPRNET

(57) ABSTRACT

A switch apparatus is provided. The switch apparatus includes a signal control switch, a switch circuit, a blocking capacitor and a surge current dissipation circuit. The signal control switch and the switch circuit are respectively controlled by a first control signal and a second control signal to be turned on or off. The blocking capacitor is serially coupled between the switch circuit and a reference voltage end. The surge current dissipation circuit includes a Zener diode circuit or at least one diode circuit, and the at least one diode circuit has one or more diodes coupled in series. The one or more diodes coupled in series are coupled between two ends of the surge current dissipation circuit according to a first polarity direction.

20 Claims, 10 Drawing Sheets

(56) References Cited

U.S. PATENT DOCUMENTS

| | | | |
|---|---|---|---|
| 8,970,279 B2* | 3/2015 | Ha | H03K 17/16 |
| | | | 327/308 |
| 2003/0117206 A1 | 6/2003 | Ohnakado | |
| 2004/0211677 A1 | 10/2004 | Lewis | |
| 2006/0119451 A1* | 6/2006 | Chen | H01L 27/088 |
| | | | 333/103 |
| 2006/0194558 A1* | 8/2006 | Kelly | H03K 17/693 |
| | | | 455/319 |
| 2010/0225378 A1* | 9/2010 | Nakatsuka | H03K 17/04123 |
| | | | 327/434 |
| 2012/0212192 A1 | 8/2012 | Peto | |
| 2016/0156178 A1 | 6/2016 | Yamamoto et al. | |
| 2017/0278840 A1 | 9/2017 | Robbins et al. | |
| 2018/0108988 A1* | 4/2018 | Liu | H01Q 3/247 |
| 2019/0140687 A1 | 5/2019 | Tombak et al. | |
| 2019/0305768 A1 | 10/2019 | Willard et al. | |

OTHER PUBLICATIONS

"Office Action of US Related Application, U.S. Appl. No. 16/515,015", dated Mar. 30, 2021, p. 1-p. 19.

* cited by examiner

US 11,050,245 B2

SWITCH APPARATUS

CROSS-REFERENCE TO RELATED APPLICATION

This application claims the priority benefit of Taiwan application serial no. 107101971, filed on Jan. 19, 2018. The entirety of the above-mentioned patent application is hereby incorporated by reference herein and made a part of this specification.

BACKGROUND OF THE INVENTION

1. Field of the Invention

The invention relates to a switch apparatus, and more particularly, to a switch apparatus capable of dissipating a surge current.

2. Description of Related Art

In the conventional technical field, protection for a surge (e.g., Electrostatic Discharge (ESD) or Electrical Overstress (EOS)) occurred in a switch apparatus is often carried out by disposing a surge current dissipation circuit (SCD-circuit) on a signal transceiving end. The SCD-circuit disposed on the signal transceiving end may cause additional parasitic effect on the signal transceiving end. Consequently, quality of transceiving signals on the signal transceiving end is then reduced in a normal operation mode. Therefore, design for the switch apparatus also becomes even more difficult. Further, when the voltage swing of a signal to be transmitted by the switch apparatus is extremely large, it is required to design the SCD-circuit by using high trigger voltage (HTV) elements so as to prevent a normal voltage operation range from being affected by the SCD-circuit. Accordingly, the SCD-circuit may occupy large circuit area or require a special HTV element manufacturing process, resulting in increases in both cost and design difficulty.

SUMMARY OF THE INVENTION

A switch apparatus in an embodiment of the invention includes a first signal control switch, a first switch circuit, a first blocking capacitor and a first surge current dissipation circuit (SCD-circuit). The first signal control switch is coupled between a first signal transceiving end and a second signal transceiving end, and configured to be turned on or off according to a first control signal. The first switch circuit is coupled between the first signal transceiving end and a first reference voltage end, and configured to be turned on or off according to a second control signal. The first blocking capacitor is serially coupled between the first switch circuit and the first reference voltage end. The first SCD-circuit has a first end coupled between the first switch circuit and the first blocking capacitor and a second end coupled to the first reference voltage end, and includes a first Zener diode circuit or at least one first diode circuit. The at least one first diode circuit has one or more first diodes coupled in series. The one or more first diodes coupled in series are coupled between the first end and the second end of the first SCD-circuit according to a first polarity direction.

A switch apparatus in an embodiment of the invention includes a first signal control switch, a first switch circuit, a first blocking capacitor, a first SCD-circuit, a second signal control switch, a second switch circuit and a second blocking capacitor. The first signal control switch is coupled between a first signal transceiving end and a second signal transceiving end, and configured to be turned on or off according to a first control signal. The first switch circuit is coupled between the first signal transceiving end and a first reference voltage end, and configured to be turned on or off according to a second control signal. The first blocking capacitor is serially coupled between the first switch circuit and the first reference voltage end. The first SCD-circuit has a first end coupled between the first switch circuit and the first blocking capacitor and a second end coupled to the first reference voltage end, and includes a first Zener diode circuit or at least one first diode circuit. The at least one first diode circuit has one or more first diodes coupled in series. The one or more first diodes coupled in series are coupled between the first end and the second end of the first SCD-circuit according to a first polarity direction. The second signal control switch is coupled between the second signal transceiving end and a third signal transceiving end, and configured to be turned on or off according to a third control signal. The second switch circuit is coupled between the third signal transceiving end and a second reference voltage end, and configured to be turned on or off according to a fourth control signal. The second blocking capacitor is serially coupled between the second switch circuit and the second reference voltage end.

Another switch apparatus in an embodiment of the invention includes a signal control switch, a switch circuit, and a SCD-circuit. The signal control switch is coupled between a first signal transceiving end and a second signal transceiving end, and configured to be turned on or off according to a first control signal. The switch circuit is coupled between the first signal transceiving end and a reference voltage end, and configured to be turned on or off according to a second control signal. The SCD-circuit is serially coupled between the switch circuit and the reference voltage end, and includes a Zener diode circuit or at least one diode circuit. The at least one diode circuit has one or more diode coupled in series. The one or more diodes coupled in series are serially coupled between the switch circuit and the reference voltage end according to a first polarity direction.

To make the above disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
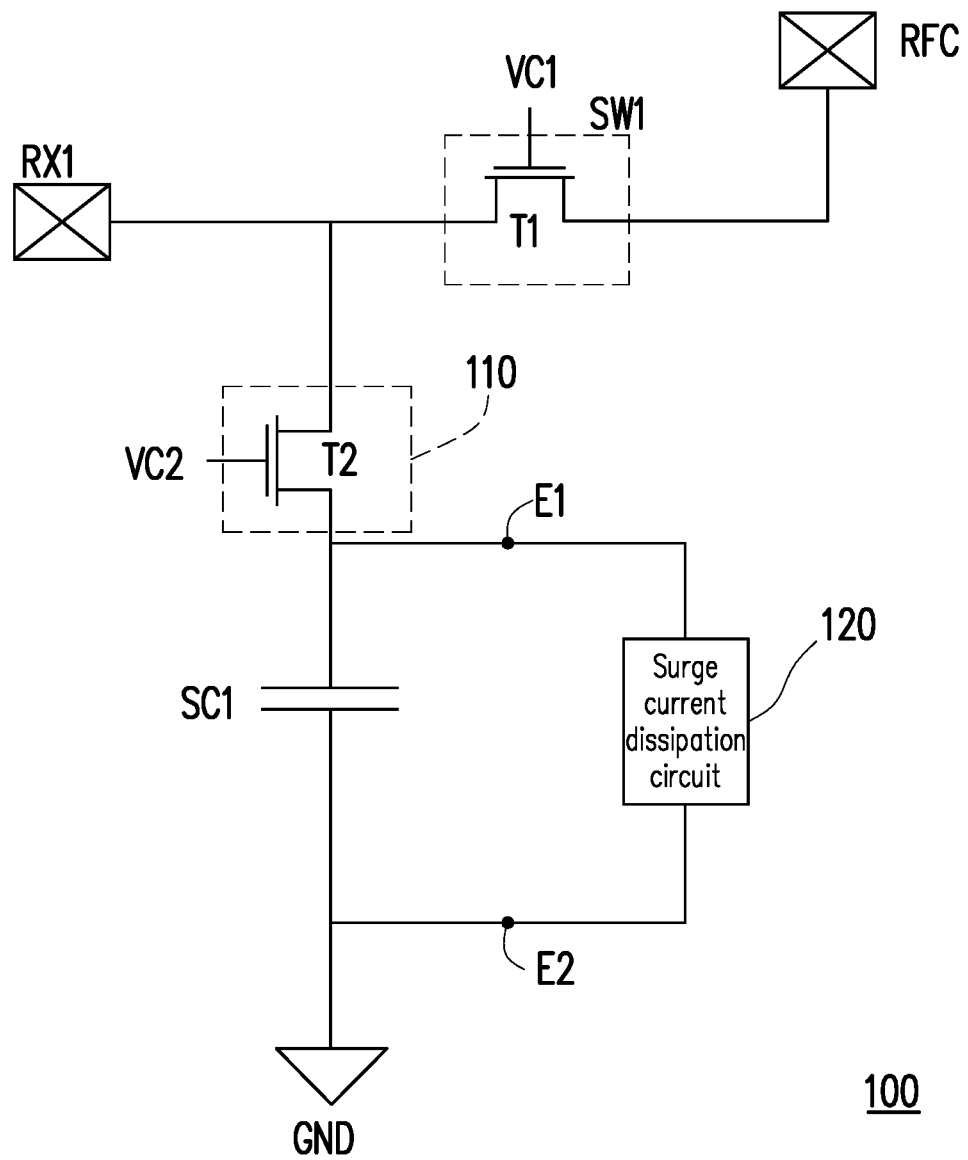
FIG. 1 is a schematic diagram illustrating a switch apparatus in an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the disclosure provide a plurality of switch apparatuses, which are capable of conducting a dissipating operation for a surge current when a surge occurs. With reference to FIG. 1, FIG. 1 is a schematic diagram illustrating a switch apparatus in an embodiment of the invention. A switch apparatus 100 may be used to transceive high frequency signals such as radio-frequency (RF) signals. The switch apparatus 100 includes a switch SW1, a switch circuit 110, a capacitor SC1 and a surge current dissipation circuit (SCD-circuit) 120. The switch SW1 includes a transistor T1, and is coupled between an end RX1 and an end RFC. The switch SW1 receives a control signal VC1 to be turned on or off under control of the control signal VC1. When the switch SW1 is turned on, a signal transmission path is provided between the ends RX1 and RFC so that signal transmission or reception may be conducted between the ends RX1 and RFC. Conversely, when the switch SW1 is turned off, the signal transmission path between the ends RX1 and RFC may be cut off. In this embodiment, the switch SW1 may be a signal control switch, the ends RX1 and RFC may be signal transceiving ends. In addition, the capacitor SC1, such as a blocking capacitor, can be configured to block a direct current (DC) signal.

The switch circuit 110 includes a transistor T2, and is coupled between the end RX1 and a voltage end GND. The capacitor SC1 is serially coupled between the switch circuit 110 and the voltage end GND. More specifically, the switch circuit 110 has a first end coupled between the end RX1 and the switch SW1, and a second end coupled to the capacitor SC1. The switch circuit 110 and the capacitor SC1 are used to form a shunt path. The switch circuit 110 receives a control signal VC2, and the switch circuit 110 is turned on or off under control of the control signal VC2. In this embodiment, the voltage end GND may be a ground end, or may be a reference voltage end of any voltage level without particular limitation. In other implementations of the invention, there may also be other switch elements coupled in series between the switch circuit 110 and the capacitor SC1.

It is noted that, when the switch SW1 is turned on according to the control signal VC1, the switch circuit 110 is turned off according to the control signal VC2 so that an external signal may be transmitted from the end RFC to the end RX1 while reducing an energy loss towards the voltage end GND. Conversely, when the switch SW1 is turned off according to the control signal VC1, the switch circuit 110 is turned on according to the control signal VC2 to be used to shunt the external signal leaked towards the end RX1 via a turn-off capacitor (Coff) of the switch SW1 so the external signal is hardly leaked to the end RX1. Aforementioned the turn-off capacitor refers to a parasitic capacitance of the switch SW1 when being turned off.

The SCD-circuit 120 has a first end E1 coupled between the switch circuit 110 and the capacitor SC1, and a second end E2 coupled to the voltage end GND. More specifically, the SCD-circuit 120 and the capacitor SC1 are coupled in parallel. When the surge occurs in the switch apparatus 100, the SCD-circuit 120 may conduct a dissipating operation for the surge current on either of the ends RFC and RX1. Here, it is important to note that, the SCD-circuit 120 includes at least one Zener diode circuit or at least one diode circuit. In this embodiment, the Zener diode circuit has one or more Zener diodes coupled in series. The diode circuit has one or more diodes coupled in series, and the one or more diodes coupled in series are coupled between the first end E1 and the second end E2 of the SCD-circuit 120 according to a first polarity direction.

Operation details regarding the SCD-circuit 120 are described below. Taking the SCD-circuit 120 that includes the Zener diode circuit as an example, when surge occurs on the end RX1 thus the surge current is generated on the switch apparatus 100, the Zener diode in the Zener diode circuit may be correspondingly broken down or turned on to provide a current dissipation path from the end RX1 via the switch circuit 110 and the SCD-circuit 120 for dissipating the surge current. Element type and/or element size commonly applied in switch circuits and/or switches can allow the surge current to directly pass through. In this embodiment, when the SCD-circuit 120 includes the diode circuit, the diode in the diode circuit may be turned on in correspondence to a polarity of aforesaid surge to provide a current dissipation path for dissipating the surge current.

It should be noted that, in this embodiment, because a turn-on voltage of the Zener diode circuit or the diode circuit included by the SCD-circuit 120 is designed to be higher than a normal operating voltage, so long as the switch apparatus 100 is in a normal operation (when no surge current is generated), neither the Zener diode circuit nor the diode circuit included by the SCD-circuit 120 will be turned on. Because the SCD-circuit 120 is not directly connected to the end RX1, (i.e., the SCD-circuit 120 is not directly connected to the end RX1 corresponding to a large voltage swing), a trigger voltage (turn-on voltage) required by the SCD-circuit 120 may be reduced, as compared to the conventional technology in which such SCD-circuit is directly connected to the end (e.g., the signal transceiving end). Therefore, the SCD-circuit 120 may be constructed by using low trigger voltage (LTV) element to effectively reduce required circuit area and design difficulty for the SCD-circuit 120. On the other hand, because the SCD-circuit 120 is not directly connected to the end RX1, the SCD-circuit 120 does not directly provide additional parasitic effect on the end RX1. Therefore, the impact on quality of transmitting signal of the end RX1 may be significantly reduced.

Figure 2A:
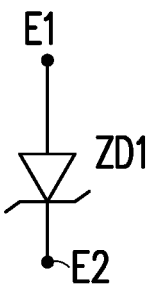
FIG. 2A-2E are schematic diagrams respectively illustrating different implementations of SCD-circuits according to the embodiments of the invention.

Refer to FIG. 2A-2E, schematic diagrams respectively illustrate different implementations of SCD-circuits according to the embodiments of the invention. In FIG. 2A, the SCD-circuit may be a Zener diode circuit which includes one single Zener diode ZD1. An anode of the Zener diode ZD1 is coupled to the first end E1 of the SCD-circuit 120, and a cathode of the Zener diode ZD1 is coupled to the second end E2 of the SCD-circuit 120. When a surge with positive voltage (e.g., an ESD voltage) is transmitted to the first end E1 of the SCD-circuit 120, the Zener diode ZD1 may be correspondingly turned on to provide the current dissipation path so that the dissipating operation may be conducted for the surge current generated by such surge. Conversely, when a surge with negative voltage is transmitted to the first end E1 of the SCD-circuit 120, the Zener diode ZD1 may be correspondingly broken down to provide the current dissipation path for dissipating the surge current generated by such surge.

Figure 2B:
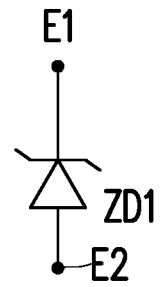

In FIG. 2B, a connecting manner of the Zener diode ZD1 in the Zener diode circuit is different from that of FIG. 2A.

In the drawing, a cathode of the Zener diode ZD1 is coupled to the first end E1 of the SCD-circuit 120, and an anode of the Zener diode ZD1 is coupled to the second end E2 of the SCD-circuit 120. When a surge with positive voltage (e.g., an ESD voltage) is transmitted to the first end E1 of the SCD-circuit 120, the Zener diode ZD1 may be correspondingly broken down to provide the current dissipation path so that the dissipating operation can be conducted for the surge current generated by the surge. Conversely, when a surge with negative voltage is transmitted to the first end E1 of the SCD-circuit 120, the Zener diode ZD1 may be correspondingly turned on to provide the current dissipation path so that the dissipating operation may be conducted for the surge current generated by the surge.

Regarding a selection of turn-on and breakdown voltages of the Zener diode circuit may be decided according to a maximum voltage difference between the first end E1 and the second end E2 of the SCD-circuit 120 when the switch apparatus is in a normal operation. Here, under the condition that the switch apparatus is in a normal operation, the selection can be made such that the Zener diode circuit is not turned on or broken down. In addition, the turn-on voltage of the Zener diode circuit may be less than the breakdown voltage of the capacitor SC1 to prevent the capacitor SC1 from damage.

In other implementations of the invention, when the Zener diode circuit includes a plurality of Zener diodes coupled in series, each of the Zener diodes may be coupled in series according to the first polarity direction or coupled in series according to a second polarity direction, or coupled in series with according to any combination of the first polarity direction and the second polarity direction. Here, the first polarity direction is opposite to the second polarity direction.

Figure 2C:
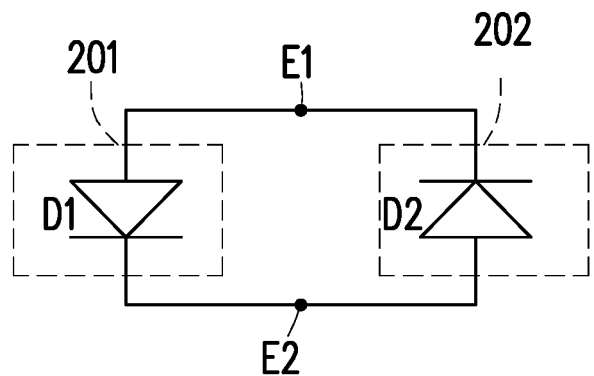

In FIG. 2C, the SCD-circuit may be diode circuits 201 and 202. The diode circuit 201 includes one single diode D1, and the diode circuit 202 includes one single diode D2. The diode D1 is coupled between the first end E1 and the second end E2 of the SCD-circuit 120 according to the first polarity direction, and the diode D2 is coupled between the first end E1 and the second end E2 of the SCD-circuit 120 according to the second polarity direction. Here, the first polarity direction is opposite to the second polarity direction. More specifically, an anode of the diode D1 in the diode circuit 201 of this embodiment is coupled to the first end E1 of the SCD-circuit 120 and its cathode is coupled to the second end E2 of the SCD-circuit 120. A cathode of the diode D2 in the diode circuit 202 is coupled to the first end E1 of the SCD-circuit 120 and an anode is coupled to the second end E2 of the SCD-circuit 120. When a surge occurs, one of the diodes D1 and D2 may be turned on according to voltage polarity and voltage difference between the first end E1 and the second end E2 of the SCD-circuit 120 to provide the current dissipation path for the surge current.

Figure 2D:
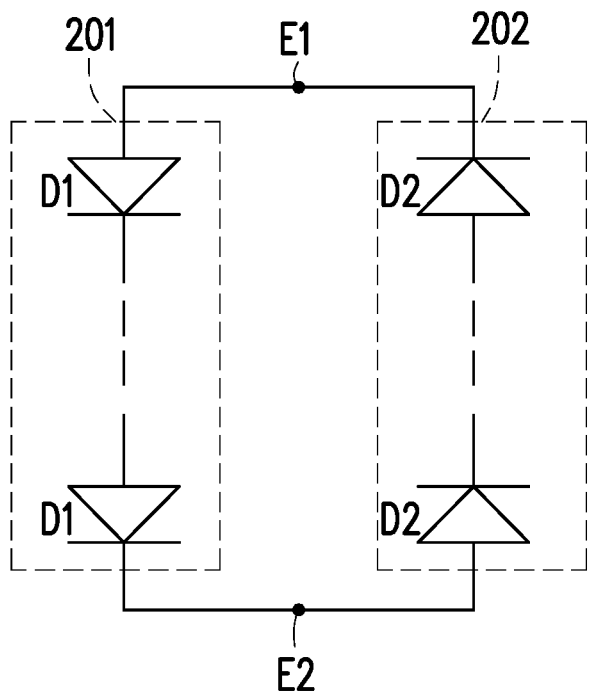
Figure 2E:
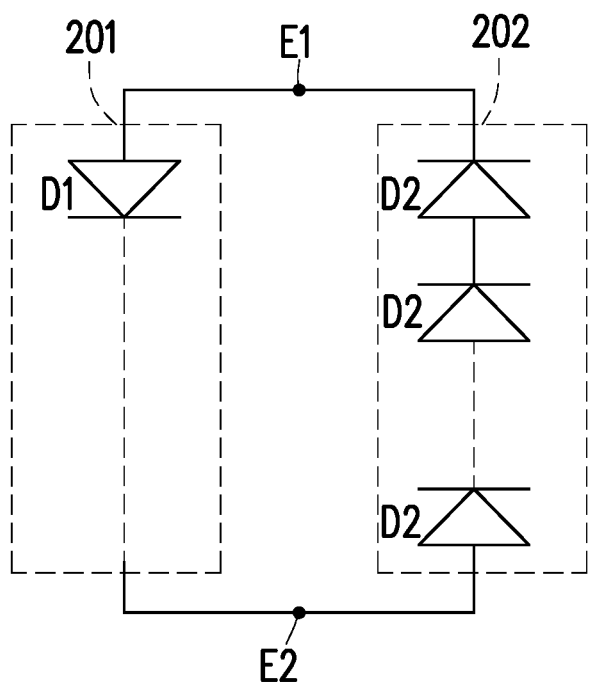

In other implementations of the invention, the diode circuits 201 and 202 may also include one or more diodes D1 and D2 coupled in series as illustrated by FIG. 2D or FIG. 2E, and a number of the diodes D1 may be less than, greater than or equal to a number of the diodes D2. In other words, the numbers of the diodes respectively included by the diode circuits 201 and 202 may be identical or different.

Incidentally, design regarding the turn-on voltages of the diode circuits 201 and 202 may be decided according to a maximum voltage difference between the first end E1 and the second end E2 of the SCD-circuit 120 when the switch apparatus is in a normal operation. Further, the turn-on voltage of the diode circuit may be less than the breakdown voltage of the capacitor SC1 to prevent the capacitor SC1 from damage. Here, under the condition that the switch apparatus is in a normal operation, both the diode circuits 201 and 202 are not turned on. In addition, the turn-on voltages of the diode circuits 201 and 202 do not have to be identical. That is to say, sums of the turn-on voltages of the diode circuits 201 and 202, respectively, may be identical or different. Designers may design the turn-on voltages by deciding numbers of the diodes included by the diode circuits 201 and 202 based on actual requirements in normal operations of the switch apparatus and the breakdown voltage of the capacitor SC1 to be protected. In other implementations of the invention, according a voltage polarity of the surge, one of the diode circuits 201 and 202 may be selectively disposed or both of them may be disposed at same time in the SCD-circuit.

Figure 3A:
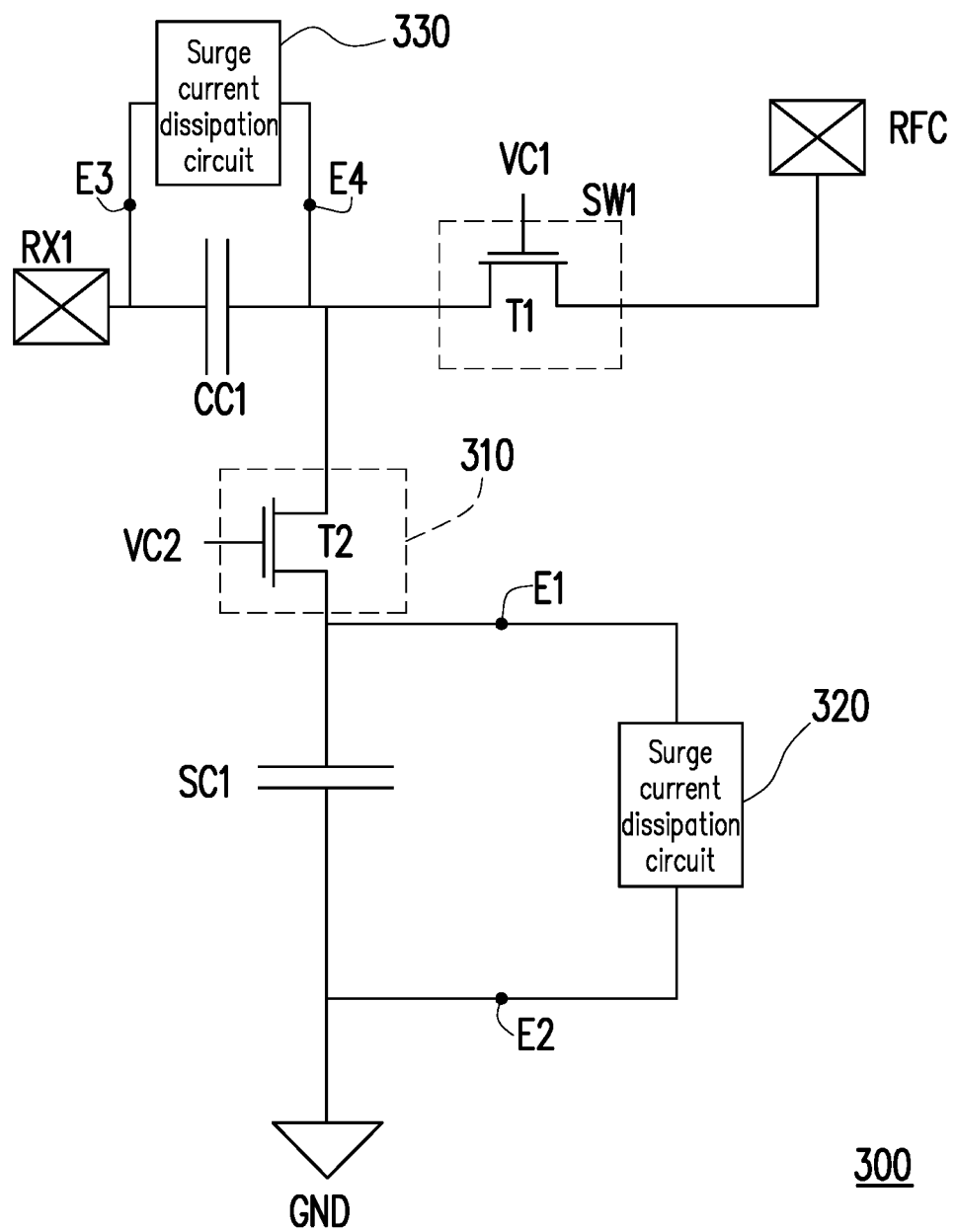
FIG. 3A-3B are schematic diagrams illustrating a switch apparatus in another embodiment of the invention.
Figure 3B:
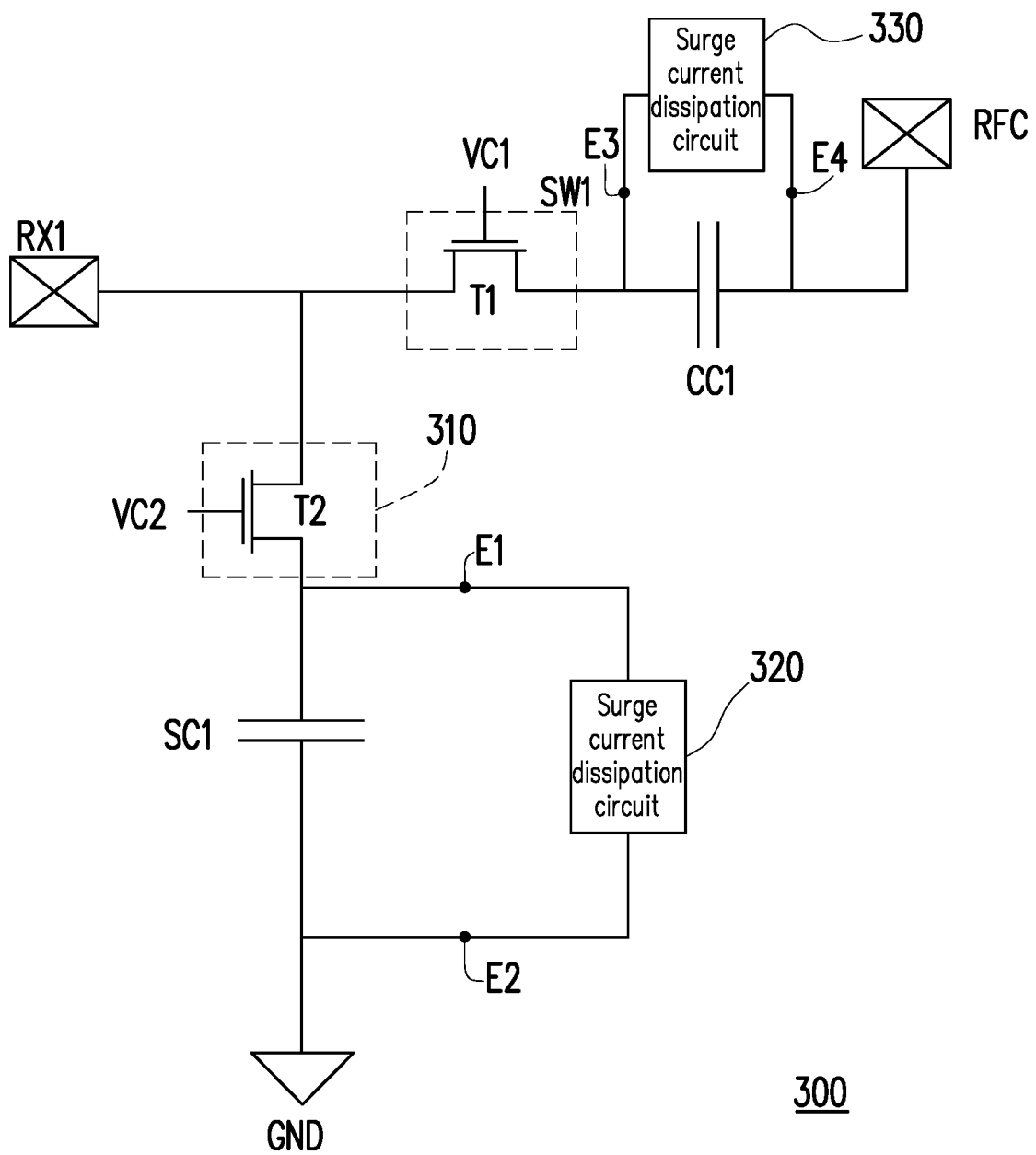

Refer to FIG. 3A and FIG. 3B, schematic diagrams illustrate switch apparatus in other embodiments of the invention. In FIG. 3A and FIG. 3B, unlike the switch apparatus 100, a switch apparatus 300 further includes a capacitor CC1 and a SCD-circuit 330. In FIG. 3A, the capacitor CC1 is serially coupled between the end RX1 and the switch SW1. The SCD-circuit 330 has a first end E3 coupled to the end RX1 and a second end E4 coupled between the capacitor CC1 and the switch SW1. More specifically, the SCD-circuit 330 and the capacitor CC1 are coupled in parallel. In this embodiment, the capacitor CC1 may be a coupling capacitor.

In this embodiment, when the switch apparatus 300 is applied in a RF circuit that requires a specific bias voltage, the capacitor CC1 may be configured to couple a high frequency signal and to block a DC signal. By coupling the SCD-circuit 330 onto the capacitor CC1 in parallel, a current dissipation path may be provided to protect the capacitor CC1 when the surge occurs on the end RX1. As such, this embodiment of the invention can reduce parasitic effect as compared to the prior art. In addition, because a large voltage difference does not exist between the two ends E3 and E4 of the SCD-circuit 330 when the switch apparatus 300 is in a normal operation, the SCD-circuit 330 may be constructed by applying LTV elements with advantages of easy design, small circuit area and low parasitic effect so as to achieve circuit elements protection capability.

On the other hand, in FIG. 3B, the capacitor CC1 may be serially coupled between the switch SW1 and the end RFC. The first end E3 of the SCD-circuit 330 may be coupled between the switch SW1 and the capacitor CC1, and the second end E4 of the SCD-circuit 330 may be coupled to the end RFC. More specifically, the SCD-circuit 330 and the capacitor CC1 coupled in parallel can achieve the same advantages as the implementation of FIG. 3A. In this embodiment, the SCD-circuit 330 may be disposed according to the implementations of FIG. 2A-2E.

Figure 4A:
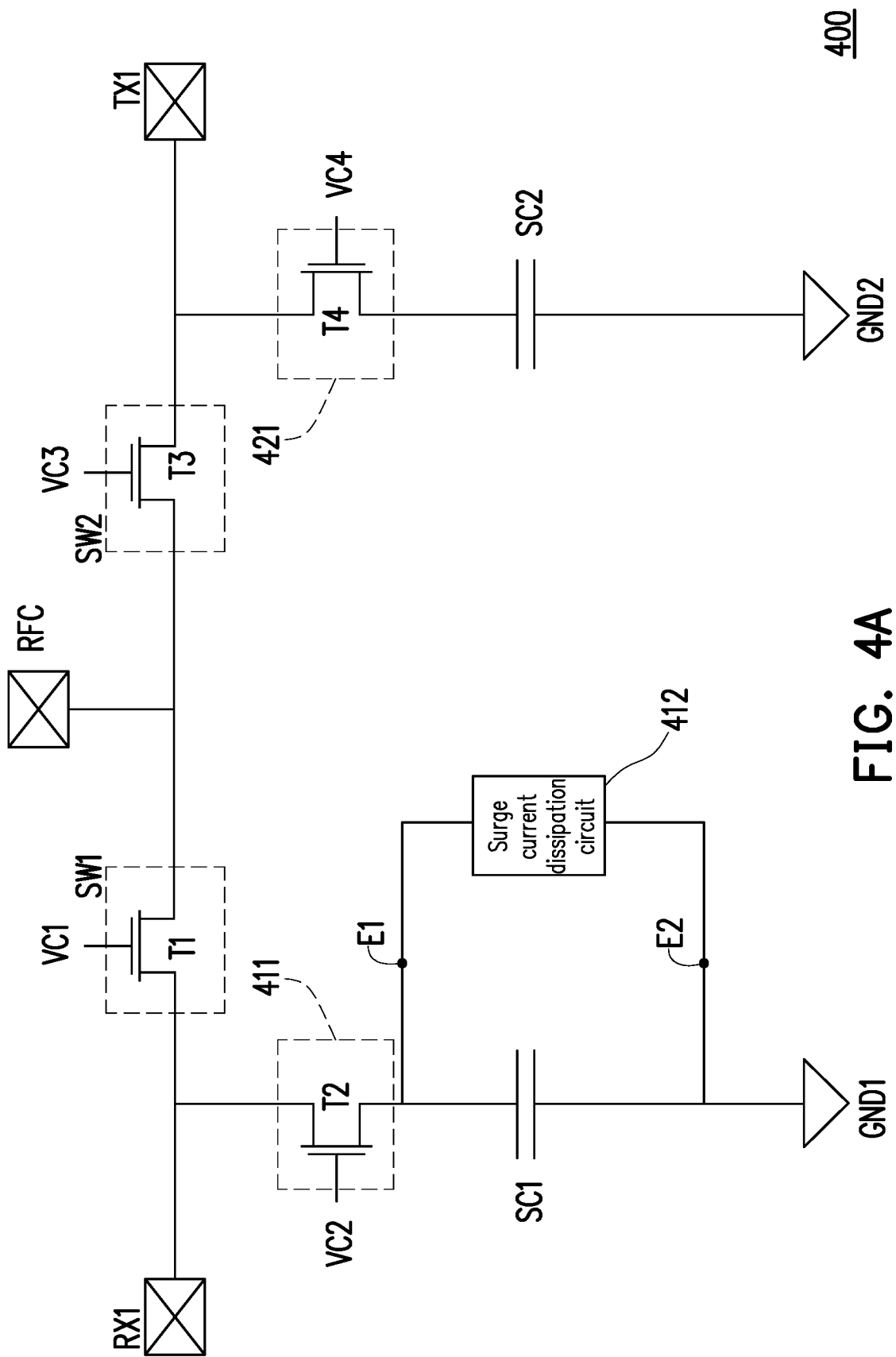
FIG. 4A-4B are schematic diagrams illustrating a switch apparatus in another embodiment of the invention.
Figure 4B:
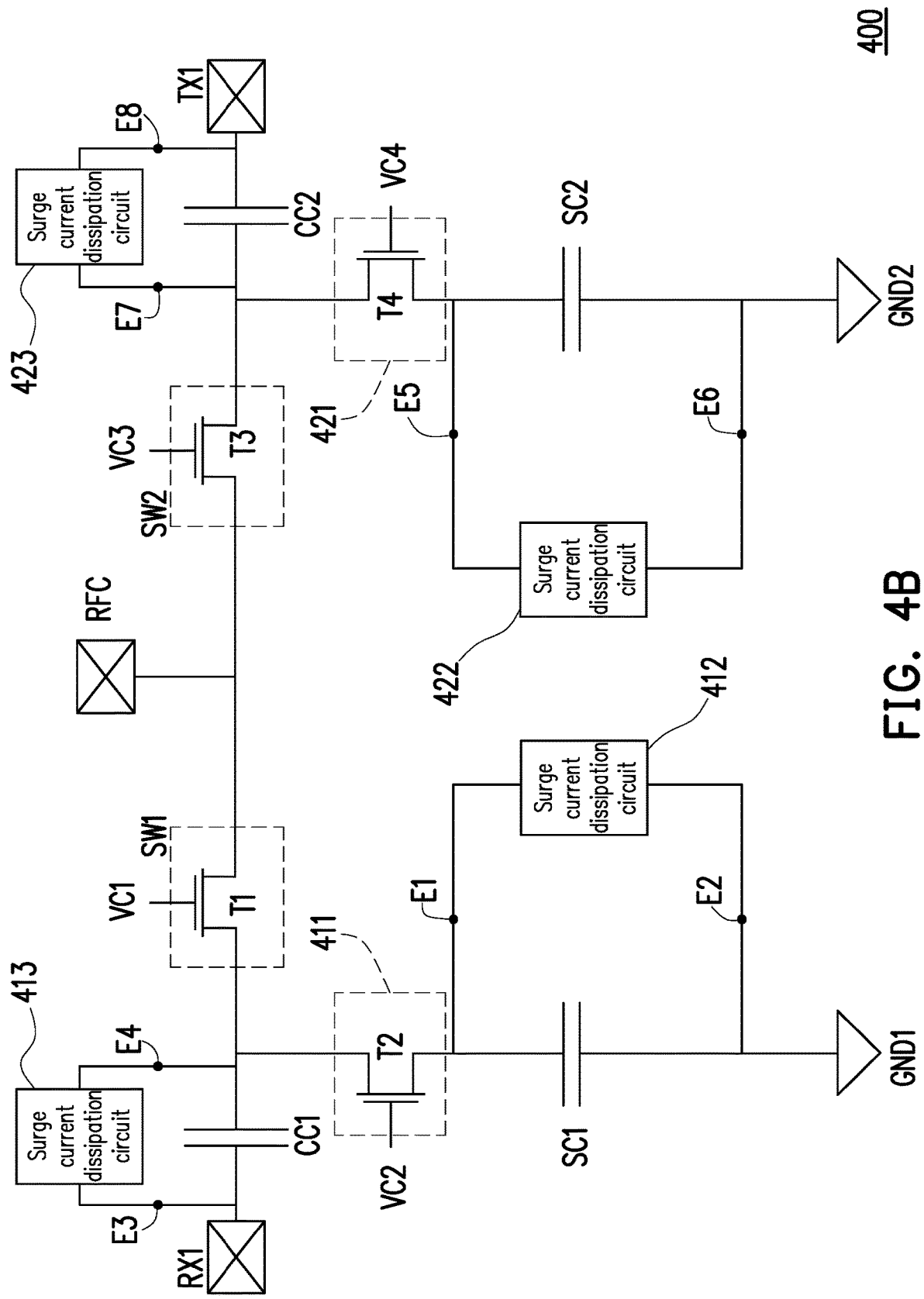

Refers to FIG. 4A and FIG. 4B, schematic diagrams illustrate switch apparatus in other embodiments of the invention. In FIG. 4A, unlike the switch apparatus 100, a switch apparatus 400 further includes a switch SW2, a switch circuit 421 and a capacitor SC2. The switch SW2 includes a transistor T3, and is coupled between the end RFC and an end TX1. The switch SW2 receives a control signal VC3 to be turned on or off under control of the control signal VC3. Here, when the switch SW1 is turned on, the switch SW2 may be turned off. Conversely, when the switch SW1 is turned off, the switch SW2 may be turned on. In other implementations of the invention, the switches SW1 and SW2 may also be turned on or off at the same time. In this embodiment, the switch SW2 may be a signal control switch, the end TX1 may be a signal transceiving end. In addition, the capacitor SC2, such as a blocking capacitor, can be configured to block a DC signal.

The switch circuit 421 includes a transistor T4, and is coupled between the end TX1 and a voltage end GND2. The capacitor SC2 is serially coupled between the switch circuit 421 and the voltage end GND2. More specifically, the switch circuit 421 has a first end coupled between the switch SW2 and the end TX1 and a second end coupled to the capacitor SC2. The switch circuit 421 and the capacitor SC2 are used to form a shunt path. The switch circuit 421 receives a control signal VC4 to be turned on or off under control of the control signal VC4. Here, when the switch SW2 is turned on, the switch circuit 421 is correspondingly turned off. Conversely, when the switch SW2 is turned off, the switch circuit 421 may be turned on. In this embodiment, a voltage end GND1 and the voltage end GND2 may be ground ends, or may be reference voltage ends of any voltage level without particular limitation, and the voltage ends GND1 and GND2 may be short-circuit to each other.

Operation details regarding the switch apparatus 400 are described below using a transmission between the ends TX1 and RFC during a signal transceiving operation as an example. If a signal on the end TX1 is to be transmitted to the end RFC, the switch SW2 and a switch circuit 411 may be turned on according to the control signals VC3 and VC2, respectively, and the switch circuit 421 and the switch SW1 may be turned off according to the control signals VC4 and VC1, respectively. Accordingly, the signal may be transmitted between the ends TX1 and RFC. A signal leaked towards the end RX1 via a turn-off capacitor of the switch SW1 may be shunted to the voltage end GND1 through the turned-on switch circuit 411 and the capacitor SC1, so as to prevent the signal on the end TX1 from being easily leaked to the end RX1. In addition, the switch circuit 421 and the switch SW1 being turned off may further block the signal transmitted between the ends TX1 and RFC from other external signals, so as to ensure quality for transmitting signals. When a signal on the end RFC is to be transmitted to the end RX1, the switch circuit 421 and the switch SW1 may be turned on according to the control signals VC4 and VC1, respectively, and the switch SW2 and the switch circuit 411 may be turned off according to the control signals VC3 and VC2, respectively. Accordingly, the signal may be transmitted between the ends RFC and RX1. A signal leaked towards the end TX1 via the turn-off capacitor of the switch SW2 may be shunted to the voltage end GND2 through the turned-on switch circuit 421 and the capacitor SC2, so as to prevent the signal on the end RFC from being easily leaked to the end TX1. In addition, the switch circuit 411 and the switch SW2 being turned off may further block the signal transmitted between the ends RFC and RX1 from other external signals, so as to ensure quality for transmitting signals.

On the other hand, when the switch apparatus 400 is in an abnormal operation (e.g., when the surge occurs), a SCD-circuit 412 can provide a current dissipation path for the surge occurred on either of the ends (e.g., the ends RX1, RFC and TX1) of the switch apparatus 400, so as to effectively protect circuit elements in the switch apparatus 400 and every connected circuit elements from being damaged by the surge thereby ensuring safety of the switch apparatus 400.

Unlike FIG. 4A, in FIG. 4B, the switch apparatus 400 further includes capacitors CC1 and CC2 and SCD-circuits 413, 422 and 423. The capacitor CC1 is serially coupled between the end RX1 and the switch SW1. The capacitor CC2 is serially coupled between the switch SW2 and the end TX1. The SCD-circuit 413 has a first end E3 coupled to the end RX1 and a second end E4 coupled between the capacitor CC1 and the switch SW1. The SCD-circuit 422 has a first end E5 coupled between the switch circuit 421 and the capacitor SC2 and a second end E6 coupled to the voltage end GND2. The SCD-circuit 423 has a first end E7 coupled between the switch SW2 and the capacitor CC2 and a second end E8 coupled to the end TX1. More specifically, the SCD-circuit 413 and the capacitor CC1 are coupled in parallel, the SCD-circuit 422 and the capacitor SC2 are coupled in parallel, and the SCD-circuit 423 and the capacitor CC2 are coupled in parallel. Compared to FIG. 4A, in addition to use of the SCD-circuit 412, by coupling the SCD-circuit 422 onto the capacitor SC2 in parallel, this embodiment can provide another current dissipation path for the surge on either of the ends (e.g., the ends RX1, RFC and TX1) of the switch apparatus 400, so as to improve dissipating capability for the surge and make RF signal characteristics and surge current protection capability symmetry for the ends RX1 and TX1. In this embodiment, the capacitors CC1 and CC2 may be coupling capacitors. Further, when the switch apparatus 400 is applied to a RF circuit that requires a specific bias voltage, by disposing the capacitors CC1 and CC2 for coupling a high frequency signal and blocking a DC signal as well as coupling the SCD-circuits 413 and 423 onto the capacitors CC1 and CC2 in parallel, current dissipation paths may be provided to protect the capacitors CC1 and CC2 when the surge occurs on the ends RX1 and TX1. In this embodiment, the SCD-circuits 412, 413, 422 and 423 may be disposed according to the implementations of FIG. 2A-2E. In other implementations of the invention, designers may selectively dispose the capacitors CC1 and CC2 and the SCD-circuits 413, 422 and 423 based on the actual operation requirements of the switch apparatus.

In other embodiments of the invention, a shunt path formed by the switch circuit 411 and the capacitor SC1 may also be directly connected between the end RX1 and the voltage end GND1, and the SCD-circuit 412 and the capacitor SC1 may be coupled in parallel. In this case, the SCD-circuits 412 and 413 may provide a current dissipation path for the surge occurred on the ends RX1 and RFC. Similarly, a shunt path formed by the switch circuit 421 and the capacitor SC2 may also be directly connected between the end TX1 and the voltage end GND2, and the SCD-circuit 422 and the capacitor SC2 may be coupled in parallel. In this case, the SCD-circuits 422 and 423 may provide another current dissipation path for the surge occurred on the ends TX1 and RFC.

Figure 5:
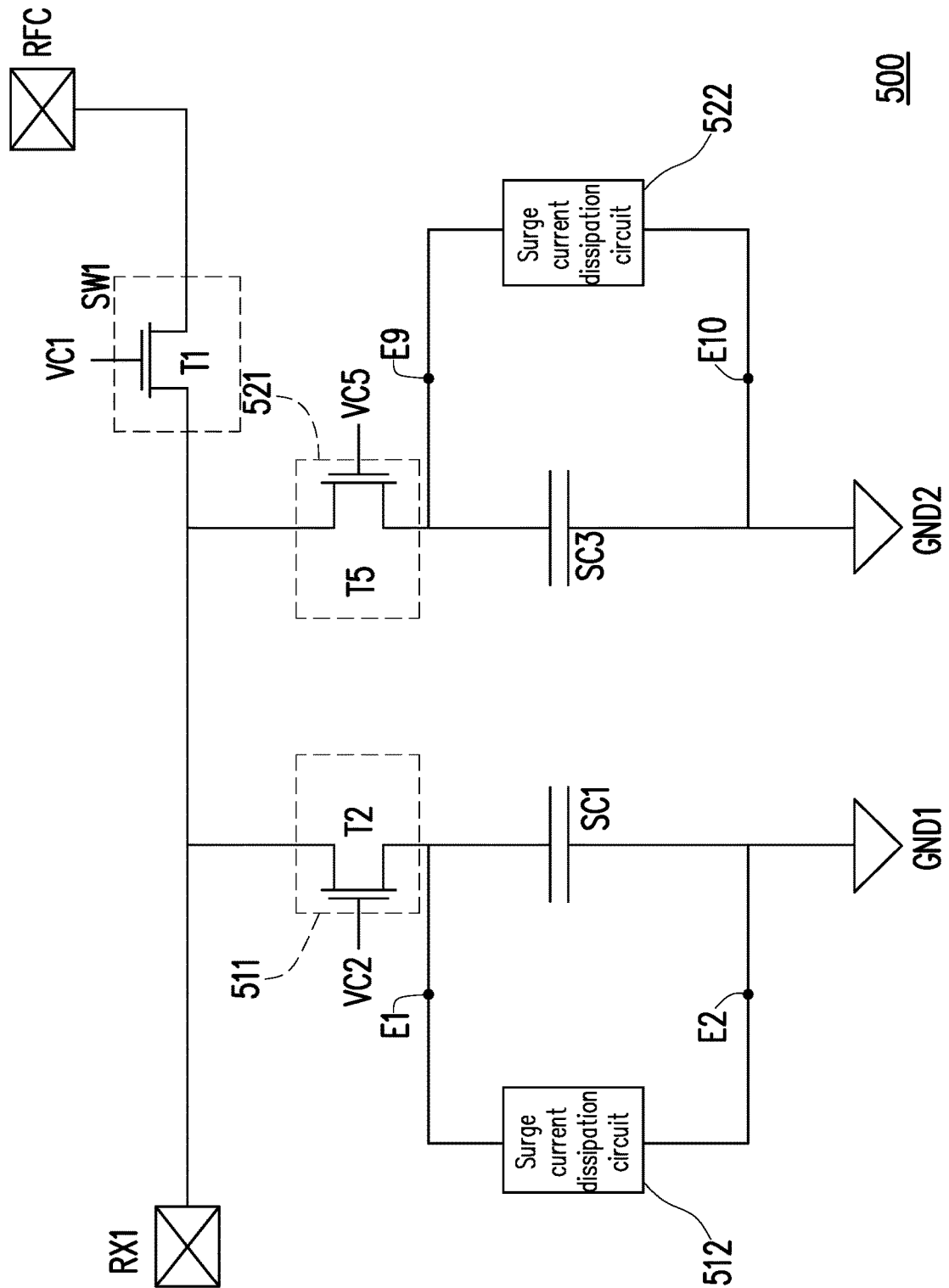
FIG. 5 is a schematic diagram illustrating a switch apparatus in another embodiment of the invention.

Refers to FIG. 5, a schematic diagram illustrates a switch apparatus in another embodiment of the invention. In FIG. 5, unlike the switch apparatus 100, a switch apparatus 500 further includes a switch circuit 521, a capacitor SC3 and a SCD-circuit 522. The switch circuit 521 includes a transistor T5, and is coupled between the end RX1 and a voltage end GND2. The capacitor SC3 is serially coupled between the switch circuit 521 and the voltage end GND2. The switch circuit 521 and the capacitor SC3 are used to form a shunt path. The SCD-circuit 522 has a first end E9 coupled between the switch circuit 521 and the capacitor SC3 and a second end E10 coupled to the voltage end GND2. More specifically, the switch circuit 521 has a first end coupled between the end RX1 and the switch SW1 and a second end coupled to the capacitor SC3. The SCD-circuit 522 and the capacitor SC3 are coupled in parallel. The switch circuit 521 receives a control signal VC5, and is configured to be turned on or off according to the control signal VC5. In this embodiment, a switch circuit 511 and the switch circuit 521 may be turned on or off at the same time, and a voltage end GND1 and the voltage end GND2 may be short-circuit to each other. In this embodiment, the capacitor SC3, such as a blocking capacitor, can be configured to block a DC signal.

For implementation regarding a SCD-circuit 512 and the SCD-circuit 522, when one of the SCD-circuits 512 and 522 is a Zener diode circuit, another one of the SCD-circuits may be a Zener diode circuit or a diode circuit. Alternatively, the SCD-circuits 512 and 522 may both be diode circuits. For instance, when the SCD-circuit 512 is a Zener diode circuit, the SCD-circuit 522 may be a diode circuit. Compared to the switch circuit 100, in addition to use of the SCD-circuit 512, by further coupling the SCD-circuit 522 onto the capacitor SC3 in parallel, this embodiment can provide another current dissipation path so the dissipating operation may be conducted for a surge occurred on either of the ends (e.g., the ends RX1 and RFC) in the switch apparatus 500 in order to improve dissipating capability for the surge.

On the other hand, when both the SCD-circuits 512 and 522 are diode circuits. The SCD-circuit 512 includes one or more diodes coupled in series, and the diodes are coupled between the two ends E1 and E2 of the SCD-circuit 512 according to a first polarity direction. The SCD-circuit 522 includes one or more diodes coupled in series, and the diodes are coupled between the two ends E9 and E10 of the SCD-circuit 522 according to a second polarity direction. More specifically, for each diode in the SCD-circuit 512, its anode is coupled to the first end E1 and its cathode is coupled to the second end E2. For each diode in the SCD-circuit 522, its cathode is coupled to the first end E9 and its anode is coupled to the second end E10. When a surge with positive voltage occurs on the end RX1, the diode(s) in the SCD-circuit 512 is correspondingly turned on to provide a current dissipation path so the dissipating operation may be conducted for the surge current generated by such surge. Conversely, when a surge with negative voltage occurs on the end RX1, the diode(s) in the SCD-circuit 522 may be correspondingly turned on to provide a current dissipation path so the dissipating operation may be conducted for the surge current generated by such surge.

Figure 6:
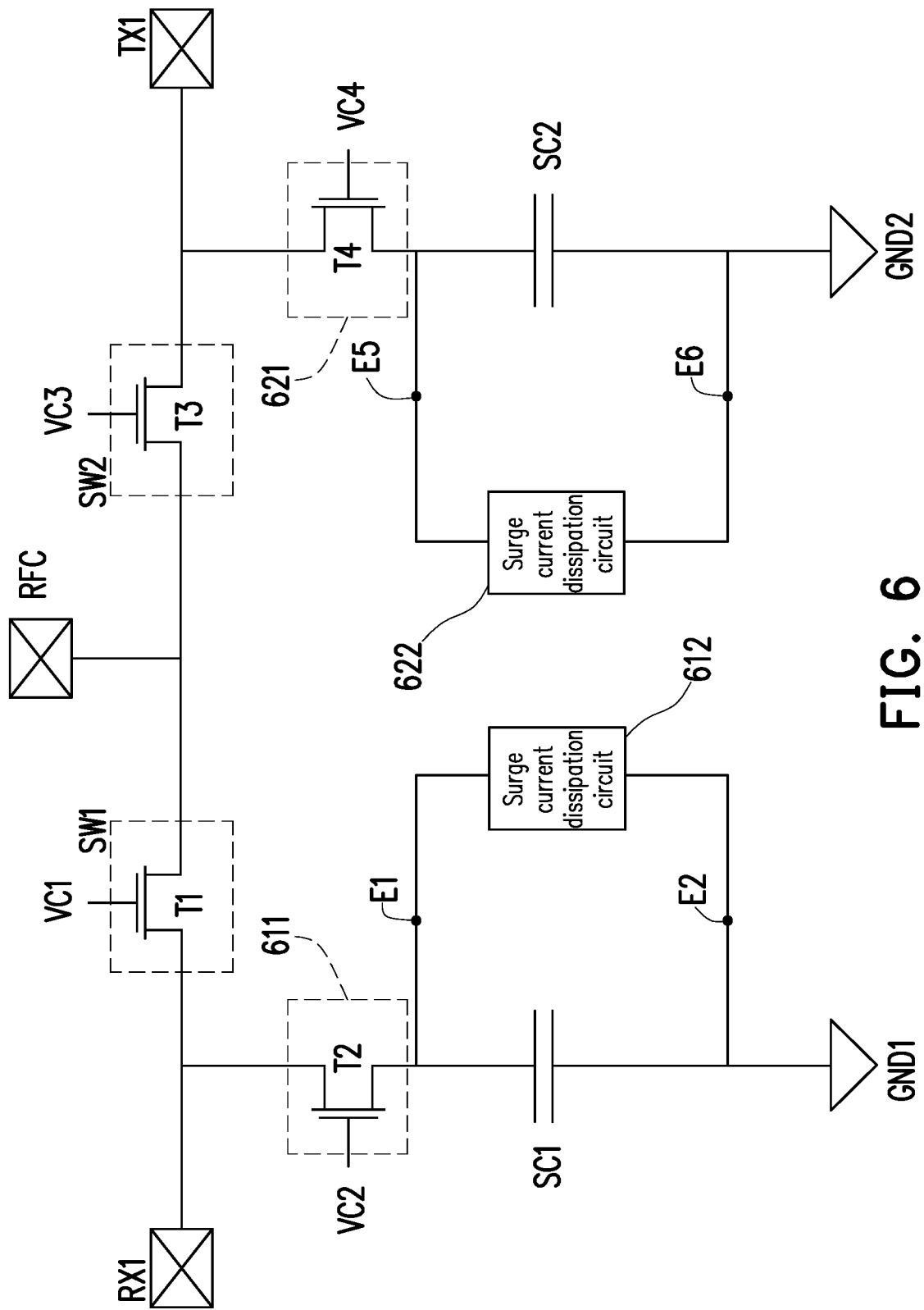
FIG. 6 is a schematic diagram illustrating a switch apparatus in another embodiment of the invention.

Refer to FIG. 6, a schematic diagram illustrates a switch apparatus in another embodiment of the invention. In FIG. 6, unlike the switch apparatus 400 of FIG. 4A, a switch apparatus 600 further includes a SCD-circuit 622. The SCD-circuit 622 has a first end E5 coupled between a switch circuit 621 and a capacitor SC2 and a second end E6 coupled to the voltage end GND2.

Regarding implementations of a SCD-circuit 612 and the SCD-circuit 622, when one of the SCD-circuits 612 and 622 is a Zener diode circuit, another one of the SCD-circuits may be a Zener diode circuit or a diode circuit. Alternatively, the SCD-circuits 612 and 622 may both be diode circuits. For instance, when the SCD-circuit 612 is a Zener diode circuit, the SCD-circuit 622 is a diode circuit. Compared to the switch apparatus 400 of FIG. 4A, in addition to use of the SCD-circuit 612, by further coupling the SCD-circuit 622 onto the capacitor SC2 in parallel, this embodiment can provide another current dissipation path so the dissipating operation may be conducted for the surge occurred on any one of the ends (e.g., the ends RX1, RFC and TX1) in the switch apparatus 600 in order to improve dissipating capability for the surge.

On the other hand, when both the SCD-circuits 612 and 622 are diode circuits, the SCD-circuit 612 includes one or more diodes coupled in series, and the diodes are coupled between the two ends E1 and E2 of the SCD-circuit 612 according to a first polarity direction, and the SCD-circuit 622 includes one or more diodes coupled in series, and the diodes are coupled between the two ends E5 and E6 of the SCD-circuit 622 according to a second polarity direction. More specifically, for each diode in the SCD-circuit 612, its anode is coupled to the first end E1 and its cathode is coupled to the second end E2. For each diode in the SCD-circuit 622, its cathode is coupled to the first end E5 and its anode is coupled to the second end E6. When a surge with positive voltage occurs on the end RX1, RFC or TX1, the diode(s) in the SCD-circuit 612 may be correspondingly turned on to provide a current dissipation path so the dissipating operation may be conducted for the surge current generated by such surge. Conversely, when a surge with negative voltage occurs on the end RX1, RFC or TX1, the diode(s) in the SCD-circuit 622 may be correspondingly turned on to provide a current dissipation path so the dissipating operation may be conducted for the surge current generated by such surge. In other implementations of the invention, the SCD-circuits 612 and 622 may be disposed according to the embodiments of FIG. 2A-2E.

Figure 7:
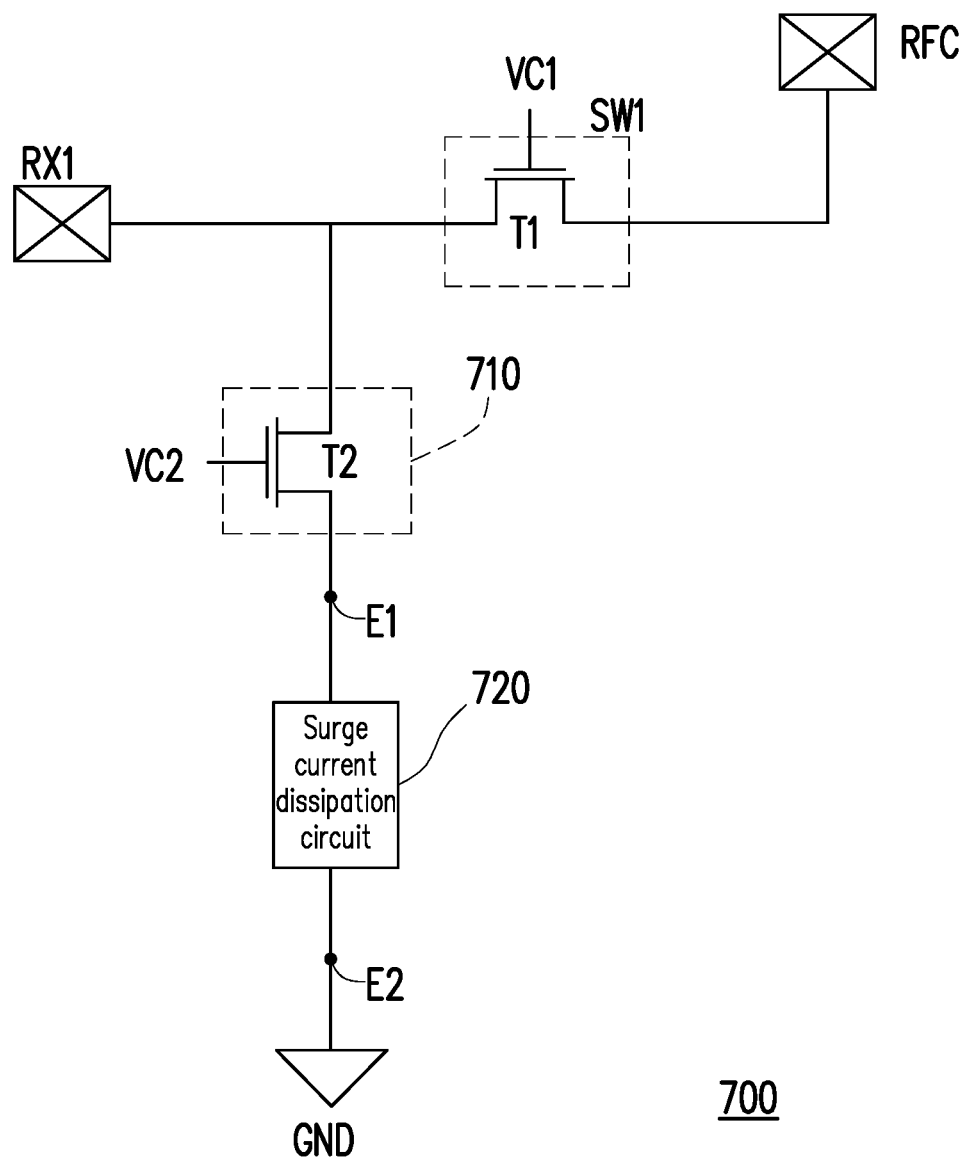
FIG. 7 is a schematic diagram illustrating a switch apparatus in yet another embodiment of the invention.

Refer to FIG. 7, a schematic diagram illustrates a switch apparatus in yet another embodiment of the invention. A switch apparatus 700 includes a switch SW1, a switch circuit 710 and a SCD-circuit 720. The switch SW1 includes a transistor T1, and is coupled between an end RX1 and an end RFC. The switch SW1 receives a control signal VC1, and is configured to be turned on or off according to the control signal VC1. The switch circuit 710 includes a transistor T2, and is coupled between the end RX1 and a voltage end GND. The switch circuit 710 receives a control signal VC2, and is configured to be turned on or off according to the control signal VC2. Unlike the foregoing embodiments, the capacitor (e.g., the capacitor SC1 or SC2) is not disposed on a shunt path of the switch apparatus 700, and the SCD-circuit 720 is serially coupled between the switch circuit 710 and the voltage end GND and configured to form a shunt path. More specifically, the switch circuit 710 has a first end coupled between the end RX1 and the switch SW1 and a second end coupled to a first end E1 of the SCD-circuit 720. A second end E2 of the SCD-circuit 720 is coupled to the voltage end GND. The SCD-circuit 720 includes at least one Zener diode circuit or at least one diode circuit. In this embodiment, the Zener diode circuit may have one or more Zener diodes coupled in series (e.g., like the implementations shown by FIG. 2A-2B). The diode circuit may have one or more diodes coupled in series, and the one or more diodes coupled in series are serially coupled between the switch circuit 710 and the voltage end GND according to a first polarity direction (e.g., like the implementations shown by FIG. 2C-2E). Among them, when the switch apparatus 700 is in a normal operation, a junction capacitor provided by the Zener diode circuit or the diode circuit in the SCD-circuit 720 may be used as the blocking capacitor with high frequency signals coupling and DC signal blocking capability. Moreover, when the switch apparatus 700 is in an abnormal operation, the SCD-circuit 720 can provide a dissipation path for the surge current so as achieve the goal of protecting the circuit elements from being damaged by the surge. In this embodiment, the switch SW1 may be a signal control switch, the ends RX1 and RFC may be signal transceiving ends.

In the embodiments of the invention, for each of the switches SW1 and SW2 and the switch circuits 110, 310, 411, 421, 511, 521, 611, 621 and 710, a number of included transistors may be one or more than one without particular limitation. Further, the transistors T1, T2, T3, T4 and T5 may be Silicon On Insulator (SOI), Pseudomorphic HEMT (pHEMT), Metal-Oxide-Semiconductor (MOS) transistors or any transistor well-known by persons with ordinary skill in the art. In other implementations of the invention, each of the switches SW1 and SW2 and the switch circuits 110, 310, 411, 421, 511, 521, 611, 621 and 710 may also be constructed by using a non transistor switch well-known by persons with ordinary skill in the art (e.g., a MicroElectro-MechanicalSystem switch (MEMS switch)). The switch apparatuses 100, 300 to 700 in the embodiments of the invention may be manufactured by applying a silicon or a gallium arsenide (GaAs) manufacturing process. In addition, the capacitors SC1, SC2 and SC3 and the capacitors CC1 and CC2 in the embodiments of the invention may be metal-insulator-metal (MIM) capacitors, metal-oxide-metal (MOM) capacitors, transistor capacitors or capacitors in any forms well-known by persons with ordinary skill in the art.

In summary, the SCD-circuit according to the invention is disposed on the shunt path of the switch apparatus, which includes the Zener diode circuit or the diode circuit to provide the surge current dissipation path for dissipating the surge current. Based on the fact that the SCD-circuit is coupled in series with the switch circuit on the shunt path, it is not required to apply HTV elements as the circuit elements in the SCD-circuit of the invention. In this way, advantages of easy design, small circuit area and low parasitic effect may be provided while achieving protection capability for the circuit elements. Furthermore, based on the fact that the SCD-circuit disposed on the shunt path is not directly connected between the end (e.g., the end RX1, RFC or TX1) and the voltage end (e.g., the voltage end GND, GND1 or GND2), quality for transmitting signal may be maintained by reducing parasitic effect on the end (e.g., the end RX1, RFC or TX1).

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A switch apparatus, comprising:
   a first signal control switch, coupled between a first signal transceiving end and a second signal transceiving end, and configured to be turned on or off according to a first control signal;
   a first switch circuit, coupled between the first signal transceiving end and a first reference voltage end, and configured to be turned on or off according to a second control signal;
   a first blocking capacitor, serially coupled between the first switch circuit and the first reference voltage end; and
   a first surge current dissipation circuit, having a first end coupled between the first switch circuit and the first blocking capacitor and a second end coupled to the first reference voltage end, and comprising a first Zener diode circuit or at least one first diode circuit, the at least one first diode circuit having one or more first diodes, wherein when more than one first diodes the first diodes are coupled in series, wherein the one or more first diodes are coupled between the first end of the first surge current dissipation circuit and the second end of the first surge current dissipation circuit according to a first polarity direction.

2. The switch apparatus of claim 1, wherein the first Zener diode circuit has one or more Zener diodes, wherein when more than one Zener diodes the Zener diodes are coupled in series.

3. The switch apparatus of claim 1, wherein a turn-on voltage of the first Zener diode circuit or a turn-on voltage of the first diode circuit is less than a breakdown voltage of the first blocking capacitor.

4. The switch apparatus of claim 1, further comprising:
   a second switch circuit, coupled between the first signal transceiving end and a second reference voltage end, and configured to be turned on or off according to a third control signal;
   a second blocking capacitor, serially coupled between the second switch circuit and the second reference voltage end; and
   a second surge current dissipation circuit, having a first end coupled between the second switch circuit and the second blocking capacitor and a second end coupled to the second reference voltage end, and comprising a second Zener diode circuit or at least one second diode circuit, the at least one second diode circuit having one or more second diodes, wherein when more than one second diodes the second diodes are coupled in series, wherein the one or more second diodes are coupled between the first end of the second surge current dissipation circuit and the second end of the second surge current dissipation circuit according to a second polarity direction, and the first polarity direction is opposite to the second polarity direction.

5. The switch apparatus of claim 1, wherein when a number of the at least one first diode circuit is 2, one of the first diode circuits is coupled between the first end of the first surge current dissipation circuit and the second end of the first surge current dissipation circuit according to the first polarity direction, another one of the first diode circuits is coupled between the first end of the first surge current dissipation circuit and the second end of the first surge current dissipation circuit according to a second polarity direction, and the first polarity direction is opposite to the second polarity direction.

6. The switch apparatus of claim 5, wherein a number of the first diodes included by said one of the first diode circuits is identical to or different from a number of the first diodes included by said another one of the first diode circuits.

7. The switch apparatus of claim 5, wherein a sum of turn-on voltages of said one of the first diode circuits is identical to or different from a sum of turn-on voltages of said another one of the first diode circuits.

8. The switch apparatus of claim 5, further comprising:
   a first coupling capacitor, serially coupled between the first signal transceiving end and the first signal control switch; and
   a second surge current dissipation circuit, having a first end coupled to the first signal transceiving end and a second end coupled between the first coupling capacitor and the first signal control switch, and comprising a second Zener diode circuit or at least two second diode circuits, each of the second diode circuits having at least one second diode, wherein one of the at least two second diode circuits is coupled between the first end of the second surge current dissipation circuit and the second end of the second surge current dissipation circuit according to the first polarity direction, and another one of the at least two second diode circuits is coupled between the first end of the second surge current dissipation circuit and the second end of the second surge current dissipation circuit according to the second polarity direction.

9. The switch apparatus of claim 5, further comprising:
a first coupling capacitor, serially coupled between the first signal control switch and the second signal transceiving end; and
a second surge current dissipation circuit, having a first end coupled between the first signal control switch and the first coupling capacitor and a second end coupled to the second signal transceiving end, and comprising a second Zener diode circuit or at least two second diode circuits, each of the second diode circuits having at least one second diode, wherein one of the at least two second diode circuits is coupled between the first end of the second surge current dissipation circuit and the second end of the second surge current dissipation circuit according to the first polarity direction, and another one of the at least two second diode circuits is coupled between the first end of the second surge current dissipation circuit and the second end of the second surge current dissipation circuit according to the second polarity direction.

10. A switch apparatus, comprising:
a first signal control switch, coupled between a first signal transceiving end and a second signal transceiving end, and configured to be turned on or off according to a first control signal;
a first switch circuit, coupled between the first signal transceiving end and a first reference voltage end, and configured to be turned on or off according to a second control signal;
a first blocking capacitor, serially coupled between the first switch circuit and the first reference voltage end;
a first surge current dissipation circuit, having a first end coupled between the first switch circuit and the first blocking capacitor and a second end coupled to the first reference voltage end, and comprising a first Zener diode circuit or at least one first diode circuit, the at least one first diode circuit having one or more first diodes, wherein when more than one first diodes are coupled in series, wherein the one or more first diodes are coupled between the first end of the first surge current dissipation circuit and the second end of the first surge current dissipation circuit according to a first polarity direction;
a second signal control switch, coupled between the second signal transceiving end and a third signal transceiving end, and configured to be turned on or off according to a third control signal;
a second switch circuit, coupled between the third signal transceiving end and a second reference voltage end, and configured to be turned on or off according to a fourth control signal; and
a second blocking capacitor, serially coupled between the second switch circuit and the second reference voltage end.

11. The switch apparatus of claim 10, wherein the first Zener diode circuit has one or more Zener diodes, wherein when more than one Zener diodes the Zener diodes are coupled in series.

12. The switch apparatus of claim 10, wherein a turn-on voltage of the first Zener diode circuit or a turn-on voltage of the first diode circuit is less than a breakdown voltage of the first blocking capacitor.

13. The switch apparatus of claim 10, further comprising:
a second surge current dissipation circuit, having a first end coupled between the second switch circuit and the second blocking capacitor and a second end coupled to the second reference voltage end, and comprising a second Zener diode circuit or at least one second diode circuit, the at least one second diode circuit having one or more second diodes, wherein when more than one second diodes the second diodes are coupled in series, wherein the one or more second diodes are coupled between the first end of the second surge current dissipation circuit and the second end of the second surge current dissipation circuit according to a second polarity direction, the first polarity direction being opposite to the second polarity direction.

14. The switch apparatus of claim 10, wherein when a number of the at least one first diode circuit is 2, one of the first diode circuits is coupled between the first end of the first surge current dissipation circuit and the second end of the first surge current dissipation circuit according to the first polarity direction, another one of the first diode circuits is coupled between the first end of the first surge current dissipation circuit and the second end of the first surge current dissipation circuit according to a second polarity direction, and the first polarity direction is opposite to the second polarity direction.

15. The switch apparatus of claim 14, further comprising:
a second surge current dissipation circuit, having a first end coupled between the second switch circuit and the second blocking capacitor and a second end coupled to the second reference voltage end, and comprising a second Zener diode circuit or at least two second diode circuits, each of the second diode circuits having at least one second diode, one of the second diode circuits being coupled between the first end of the second surge current dissipation circuit and the second end of the second surge current dissipation circuit according to the first polarity direction, another one of the second diode circuits being coupled between the first end of the second surge current dissipation circuit and the second end of the second surge current dissipation circuit according to the second polarity direction.

16. The switch apparatus of claim 14, further comprising:
a first coupling capacitor, serially coupled between the first signal transceiving end and the first signal control switch; and
a third surge current dissipation circuit, having a first end coupled to the first signal transceiving end and a second end coupled between the first coupling capacitor and the first signal control switch,
wherein the third surge current dissipation circuit comprises a third Zener diode circuit or at least two third diode circuits, each of the third diode circuits has at least one third diode, one of the third diode circuits is coupled between the first end of the third surge current dissipation circuit and the second end of the third surge current dissipation circuit according to the first polarity direction, and another one of the third diode circuits is coupled between the first end of the third surge current dissipation circuit and the second end of the third surge current dissipation circuit according to the second polarity direction.

17. The switch apparatus of claim 16, further comprising:
a second coupling capacitor, serially coupled between the second signal control switch and the third signal transceiving end; and
a fourth surge current dissipation circuit, having a first end coupled between the second signal control switch and the second coupling capacitor and a second end coupled to the third signal transceiving end, wherein the fourth surge current dissipation circuit comprises a fourth Zener diode circuit or at least two fourth diode circuits, each of the fourth diode circuits has at least one fourth diode, one of the fourth diode circuits is coupled between the first end of the fourth surge current dissipation circuit and the second end of the fourth surge current dissipation circuit according to the first polarity direction, and another one of the fourth diode circuits is coupled between the first end of the fourth surge current dissipation circuit and the second end of the fourth surge current dissipation circuit according to the second polarity direction.

18. A switch apparatus, comprising:

a signal control switch, coupled between a first signal transceiving end and a second signal transceiving end, and configured to be turned on or off according to a first control signal;

a switch circuit, coupled between the first signal transceiving end and a reference voltage end, and configured to be turned on or off according to a second control signal; and a surge current dissipation circuit, serially coupled between the switch circuit and the reference voltage end, and comprising a Zener diode circuit or at least one diode circuit, the at least one diode circuit having one or more diodes, wherein when more than one diodes the diodes are coupled in series, wherein the one or more diodes are serially coupled between the switch circuit and the reference voltage end according to a first polarity direction.

19. The switch apparatus of claim 18, wherein the Zener diode circuit has one or more Zener diodes, wherein when more than one Zener diodes the Zener diodes are coupled in series.

20. The switch apparatus of claim 18, wherein when a number of the at least one diode circuit is 2, one of the diode circuits is serially coupled between the switch circuit and the reference voltage end according to the first polarity direction, another one of the diode circuits is serially coupled between the switch circuit and the reference voltage end according to a second polarity direction, and the first polarity direction is opposite to the second polarity direction.

* * * * *